(12) United States Patent  (10) Patent No.: US 7,745,277 B2
Chidambarrao et al.  (45) Date of Patent: *Jun. 29, 2010

(54) MOSFET PERFORMANCE IMPROVEMENT USING DEFORMATION IN SOI STRUCTURE

(75) Inventors: Dureseti Chidambarrao, Weston, CT (US); Omer H. Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/065,061

(22) Filed: Feb. 25, 2005

(65) Prior Publication Data

US 2005/0142788 A1   Jun. 30, 2005

Related U.S. Application Data

(62) Division of application No. 10/605,167, filed on Sep. 12, 2003, now Pat. No. 6,887,751.

(51) Int. Cl.
  *H01L 21/8238* (2006.01)
(52) U.S. Cl. ............... 438/199; 438/200; 438/275; 438/276; 257/E21.633
(58) Field of Classification Search ......... 438/275–308, 438/310–311, 199–202; 257/E21.633
  See application file for complete search history.

(56) References Cited

U.S. PATENT DOCUMENTS

| 3,602,841 | A | 8/1971 | McGroddy |
| 4,665,415 | A | 5/1987 | Esaki et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |
| 5,060,030 | A | 10/1991 | Hoke |
| 5,081,513 | A | 1/1992 | Jackson et al. |
| 5,108,843 | A | 4/1992 | Ohtaka et al. |

(Continued)

FOREIGN PATENT DOCUMENTS

JP    64-76755    3/1989

OTHER PUBLICATIONS

Kern Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—H. Jey Tsai
(74) *Attorney, Agent, or Firm*—Joseph P. Abate; Roberts Mlotkowski Safran & Cole, P.C.

(57) ABSTRACT

A method for manufacturing a semiconductor device is provided. The method includes forming a semiconductor layer on a substrate. The first region of the substrate is expanded to push up the first portion of the semiconductor layer, thereby applying tensile stress to the first portion. The second region of the substrate is compressed to pull down the second portion of the semiconductor layer, thereby applying compressive stress to the second portion. An N type device is formed over the first portion of the semiconductor layer, and a P type device is formed over the second portion of the semiconductor layer.

19 Claims, 4 Drawing Sheets

U.S. PATENT DOCUMENTS

| | | |
|---|---|---|
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,876 B1 | 7/2001 | Crowder et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,727,549 B1 * | 4/2004 | Doyle .................... 257/347 |
| 6,764,908 B1 * | 7/2004 | Kadosh et al. ............. 438/285 |
| 6,790,749 B2 * | 9/2004 | Takemura et al. ........... 438/486 |
| 6,825,529 B2 | 11/2004 | Chidambarrao et al. |
| 6,831,292 B2 | 12/2004 | Currie et al. |
| 6,887,751 B2 * | 5/2005 | Chidambarrao et al. ..... 438/216 |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0111699 A1 * | 6/2003 | Wasshuber et al. .......... 257/414 |
| 2004/0238914 A1 | 12/2004 | Deshpande et al. |
| 2004/0253776 A1 * | 12/2004 | Hoffmann et al. ........... 438/199 |
| 2004/0262784 A1 | 12/2004 | Doris et al. |
| 2005/0037596 A1 * | 2/2005 | Erokhin et al. .............. 438/471 |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojuction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

\* cited by examiner

MOSFET PERFORMANCE IMPROVEMENT USING DEFORMATION IN SOI STRUCTURE

This application is a continuation application of U.S. application Ser. No. 10/605,167, filed on Sep. 12, 2003, now U.S. Pat. No. 6,887,751 which is now incorporated herein by reference in its entirety.

BACKGROUND OF THE INVENTION

1. Field of the Invention

The invention generally relates to methods for manufacturing a semiconductor device with improved device performance, and more particularly to methods for manufacturing semiconductor devices by imposing tensile and compressive stresses in the substrate.

2. Background Description

Mechanical stresses (e.g., tensile stress and compressive stress) within a semiconductor substrate can modulate device performance, which means stresses within a semiconductor substrate enhance semiconductor device characteristics. Thus, the characteristics of a semiconductor device can be improved by creating tensile and/or compressive stresses in the channel regions of an N type device (e.g., NFET) and/or a P type device (e.g., PFET). However, the same stress component, either tensile or compressive stress, discriminatively affects the characteristics of an N type device and a P type device. For example, when tensile stress is applied to a device in the direction of current flow, the performance of an N type device is enhanced but the performance of a P type device is degraded. Thus, in order to maximize the performance of both N type and P type devices formed on the same semiconductor substrate, each stress component should be selectively engineered and applied to either NFETs or PFETs.

To selectively create tensile stress to an N type device and compressive stress to a P type device, respectively, distinctive processes and different combinations of materials are used. For example, a trench isolation structure can be used in forming N type and P type devices. When the trench isolation structure is formed, an isolation region for the N type device contains the isolation material which applies appropriate stress to the N type device in a longitudinal direction and in a transverse direction. Further, the first isolation region and the second isolation region are provided for the P type, which apply a unique mechanical stress on the P type device in the longitudinal direction.

Alternatively, liners can be formed on the side surfaces of a gate electrode, to selectively induce appropriate stress types in the channels of the N type or P type devices. By providing liners, it is possible to apply appropriate stress closer to the device than relying on the trench isolation fill technique.

While these methods enables selectively applying tensile stress to the N type device and compressive stress to the PFET device along the longitudinal direction, they require more complicated processing steps and specific materials, thereby increasing manufacturing costs. Further, only a moderate amount of stress is obtained, such as only in the order of hundreds of MPa.

Therefore, there is a need for more cost effective and cost-effective methodology for creating larger amounts of tensile and compressive stresses for both N type and P type devices without departing from readily available processing techniques.

SUMMARY OF THE INVENTION

In an aspect of the invention, a method for manufacturing a semiconductor device is provided. The method includes forming a semiconductor layer on a substrate. The first region of the substrate is expanded to push up the first portion of the semiconductor layer. The second region of the substrate is shrunk or compressed to pull down the second portion of the semiconductor layer. An N type device is formed over the first portion of the semiconductor layer. A P type device is formed over the second portion of the semiconductor layer.

In another aspect of the invention, a method of manufacturing a semiconductor device is provided. A semiconductor layer is formed on a substrate. An expansion element is selectively ion-implanted in the first region of the substrate. A compression element is selectively ion-implanted in the second region of the substrate. Annealing is performed to expand the first region and to shrink or compress the second region. The expanded first portion pushes up the first portion of the semiconductor layer and the compressed second portion pulls down the second portion of the semiconductor layer. An N type device is formed on the first portion of the semiconductor layer. A P type device is formed on the second portion of the semiconductor layer.

Yet another aspect of the invention is a semiconductor having a substrate comprising an expanded region and a compressed region. A semiconductor layer is formed on the substrate and have the first portion pushed up by the expanded region and the second portion pulled down by the compressed region. An N type device is formed on the first portion, and a P type device formed on the second portion.

DETAILED DESCRIPTION OF EMBODIMENTS OF THE INVENTION

The invention introduces a method for increasing device performances for both an N type device and a P type device, which is easily integrated into conventional processing steps without significantly increasing manufacturing costs. This is achieved by selectively introducing tensile and compressive strains in portions of a semiconductor substrate or layer on which an N type device and a P type device are formed. In general, the tensile strain is introduced by expanding a portion of the substrate or layer for the N type device, and the compressive strain is introduced by compressing a portion of the substrate or layer for the P type device.

Figure 1:
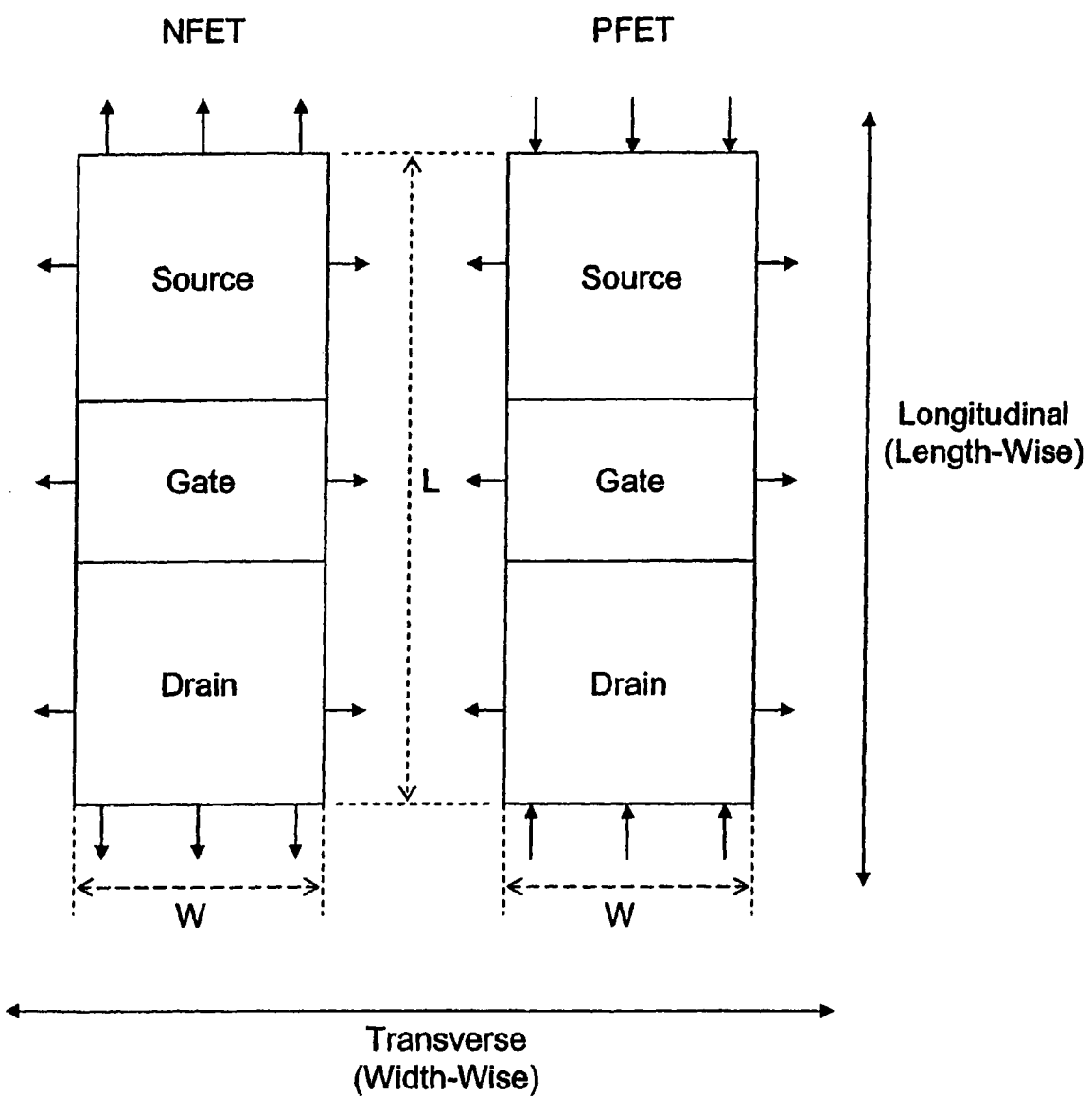
FIG. 1 depicts desired tensile and compressive stress for an N type device and a P type device, respectively.

FIG. 1 illustrates desired stress types for improving the performance of an N type device (e.g., NFET) and a P type device (e.g., PFET). Each of the NFET and PFET has a source region, a gate region and a drain region, as shown therein. The arrows extending outwardly from the active area illustrate tensile stress, and the arrows extending inwardly towards the PFET device illustrate compressive stress. The arrows outwardly extending from the NFET in both the transverse and longitudinal directions illustrate tensile stress desirable for the NFET. Similarly, the arrows extending inwardly towards the PFET in the longitudinal direction illustrates compressive stress desirable for the PFET. The range of stresses needed to influence device drive currents is of the order of a few hundred MPa to a few GPa. The width and the length of the active area of each device is represented by "W" and "L", respectively.

Figure 2:
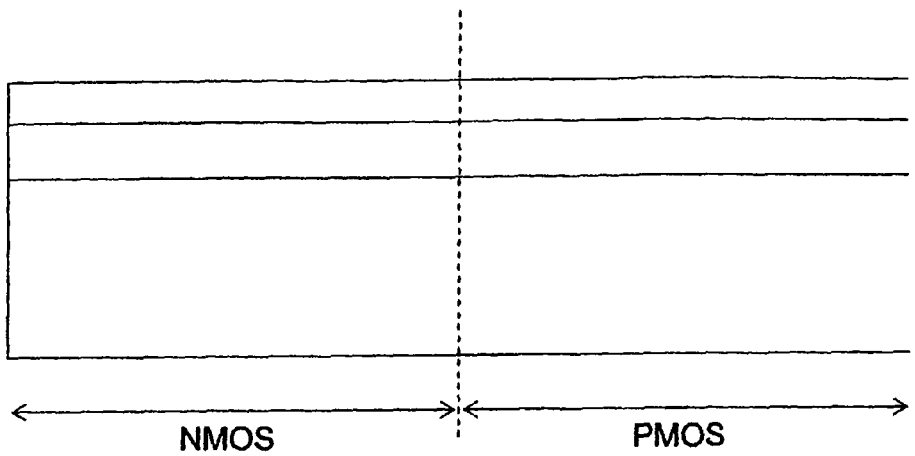
FIGS. 2 to 7 depict sequential phases of the method according to an embodiment of the invention.
Figure 3:
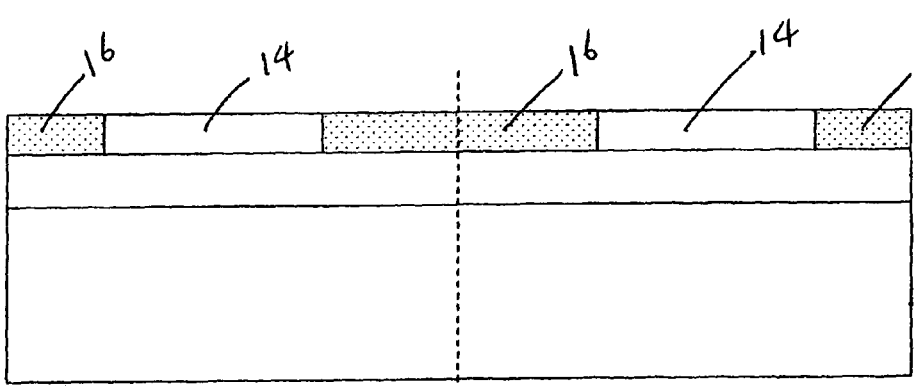

FIG. 2 shows a substrate structure that is divided into an NMOS region and a PMOS region for illustration purposes. Particularly shown is a silicon-on-insulation (SOI) type substrate structure. The substrate structure has a semiconductor substrate 10, which is typically a silicon substrate, a buried oxide layer 12 formed on the substrate 10, and a semiconductor layer 14, which is typically a silicon layer, formed on the buried oxide layer 12. Subsequently, as shown in FIG. 3, shallow trench isolation (STI) regions 16 are formed in portions of the semiconductor layer 14 to isolate individual device regions from each other.

Figure 4:
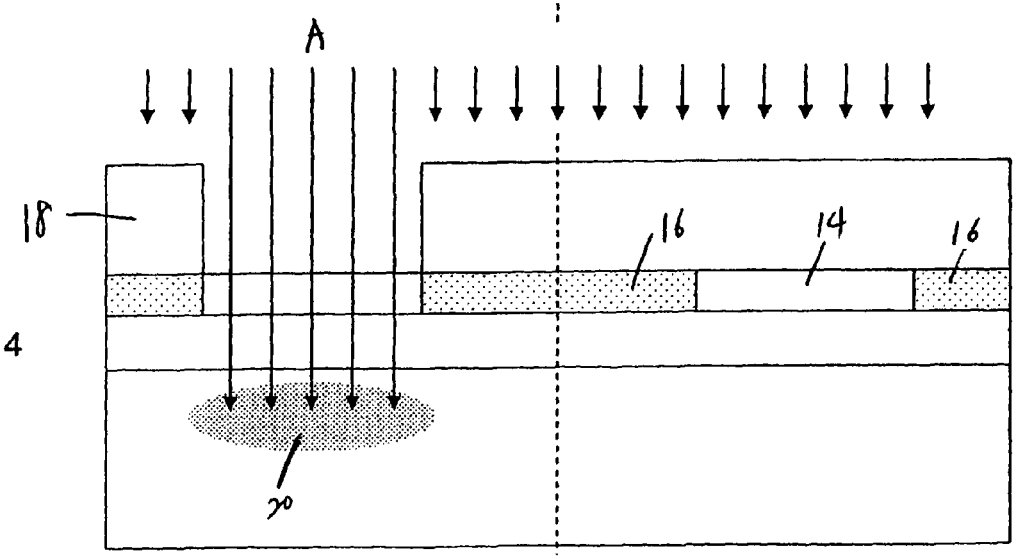

As shown in FIG. 4, the first mask layer 18 is formed on the substrate structure to selectively expose the device region of the NMOS region while masking the PMOS region. Subsequently, an expansion element (e.g., $O_2$) is ion-implanted, as shown by arrows "A", onto the exposed surface portion of the semiconductor layer 14 in the NMOS region. The ion-implantation is controllably performed such that the implanted expansion element forms the first region 20 in a portion of the substrate 10 underlying the exposed surface portion. Also, the concentration peak of the implanted expansion element is confined within the first region 20. In an embodiment, the expansion element is ion-implanted at an implantation concentration of approximately $1\times10^{14}$ atoms/cm$^2$ to $5\times10^{16}$ atoms/cm$^2$ and at an implantation energy of approximately 30 KeV to 300 KeV.

Figure 5:
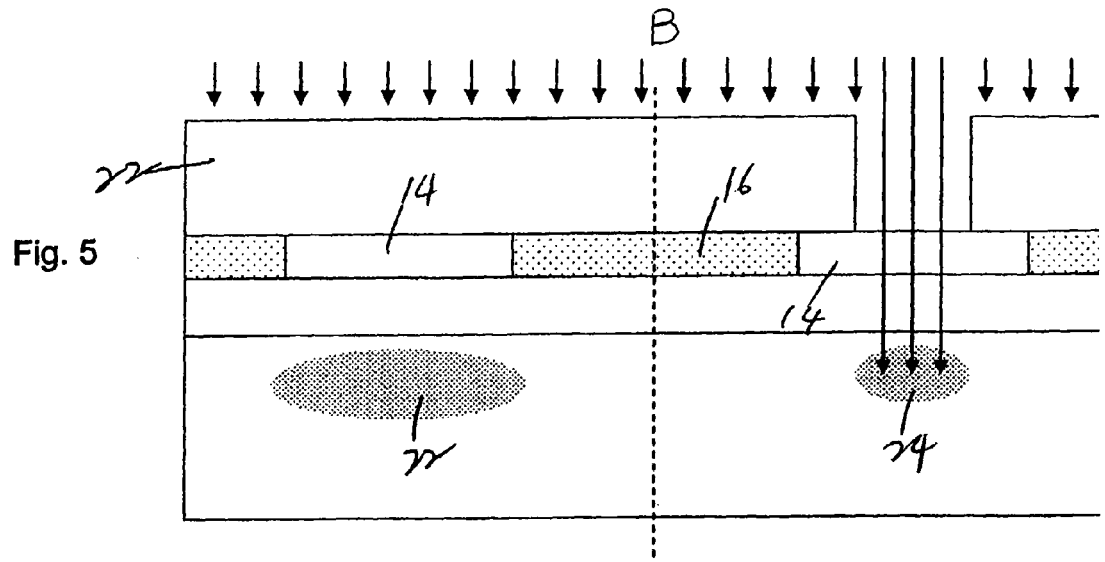

After removing the first mask 18 from the substrate structure, as shown in FIG. 5, the second mask 22 is formed thereon to selectively expose the device region of the PMOS region while masking the NMOS region. Subsequently, as shown by arrows "B", a compression element (e.g., He, Ar or other noble gas) is ion-implanted, onto the exposed surface portion of the semiconductor layer 14 in the PMOS region.

The ion-implantation process is controllably performed such that the implanted compression element forms a second region 24 in a portion of the substrate underlying the exposed surface portion. Also, the concentration peak of the implanted compression element is confined within the second region 24. In an embodiment, the compression element is ion-implanted at an implantation concentration of approximately $1\times10^{14}$ atoms/cm$^2$ to $5\times10^{16}$ atoms/cm$^2$ and at an implantation energy of approximately 30 KeV to 300 KeV.

Figure 6:
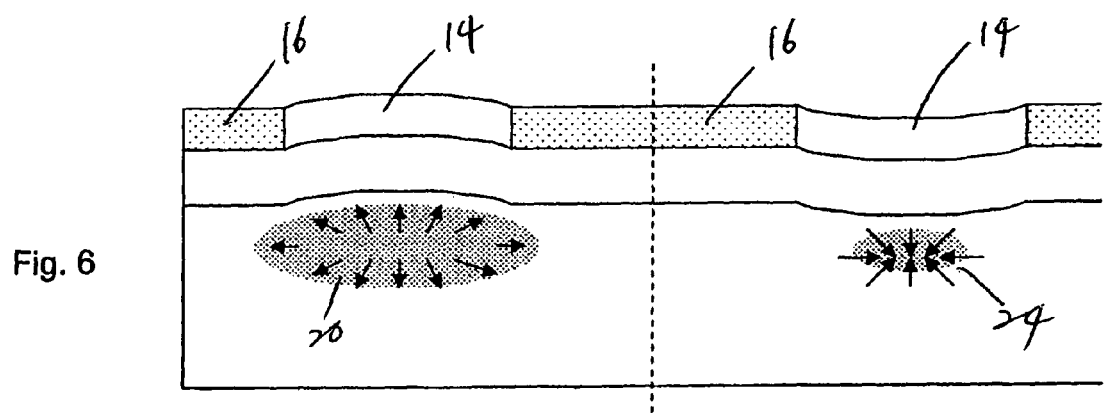

Upon forming the first region 20 containing the expansion element and the second region 24 containing the compression element, annealing is performed to activate the implanted expansion element and the compression element. As shown in FIG. 6, when annealing is performed, the first region 20 is activated and the expansion element expands the area that was previously occupied by the first region. This occurs through internal oxidation when the implanted $O_2$ reacts with the silicon and converts to silicon dioxide with its associated volume expansion. This expansion pushes up the portions of the oxide layer 12 and the semiconductor layer 14 overlying the expanded area, thereby increasing tensile stress in the surface portion of the semiconductor layer 14 overlying the expended area.

Also, upon annealing, the second region 24 is activated and the compression element shrinks the area which was previously occupied by the second region. This compression pulls down the portions of the oxide layer 12 and the semiconductor layer 14 overlying the compressed area, thereby increasing compressive stress in the surface portion of the semiconductor layer 14 overlying the compressed area. The respective arrows shown in FIG. 6 illustrate the regions 22 and 24 being expanding and compressed upon annealing.

Figure 7:
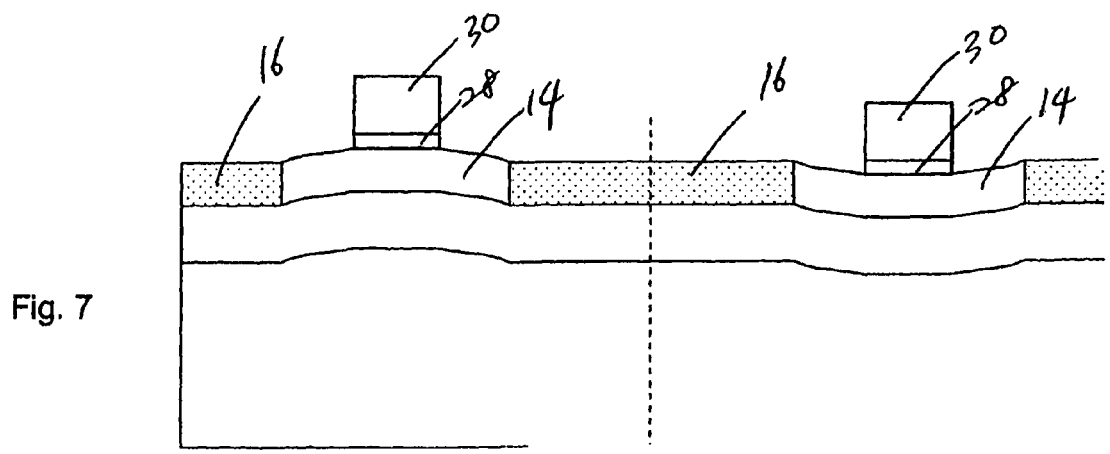

FIG. 7 shows gate electrodes 30 formed on the semiconductor layer 14 with a gate oxide layer 28 therebetween in the NMOS area and the PMOS area. Although it is not shown here, further processing steps would include forming N type source and drain regions in the NMOS area to constitute an N type device and P type source and drain regions in the PMOS area to constitute a P type device. Since the N type device is formed on the portion of the semiconductor layer 14 that has tensile strain, the performance of the N type device is significantly improved. Also, due to the compressive strain the performance of the P type device is significantly improved.

Figure 8:
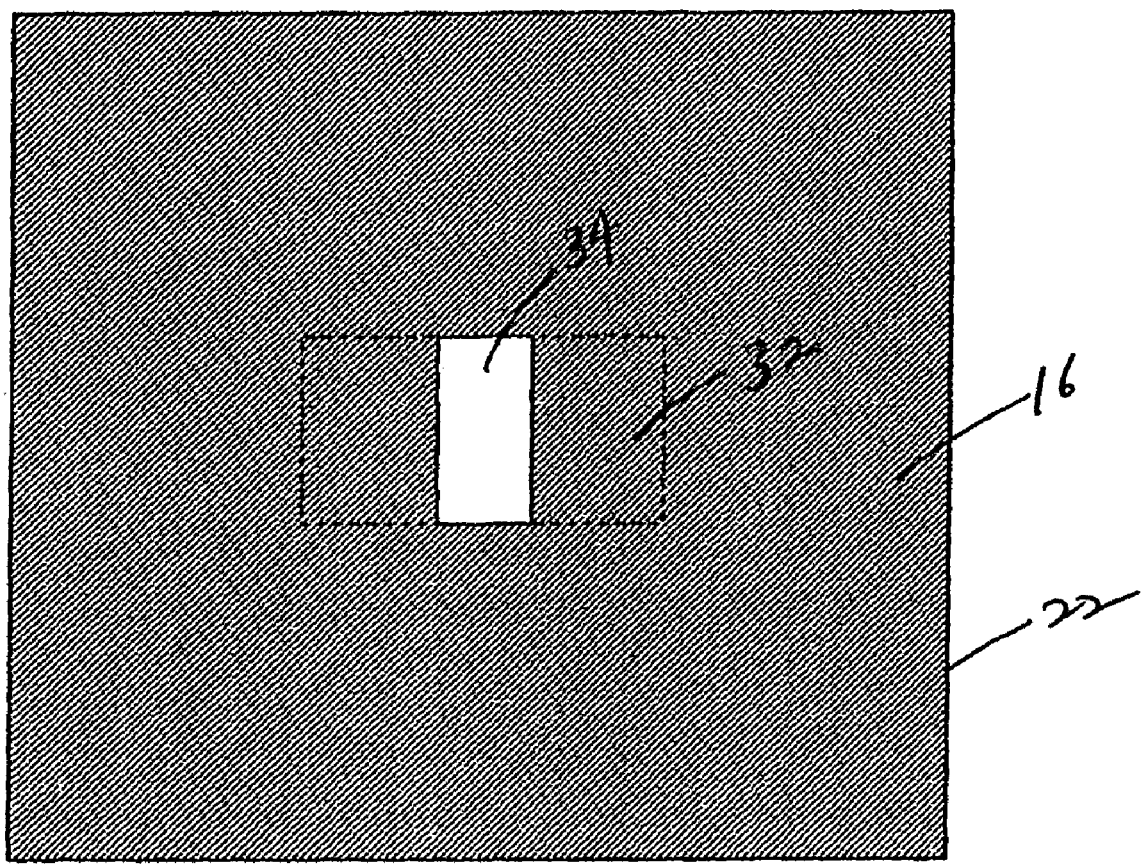
FIG. 8 depicts a top view of a semiconductor device shown in FIG. 3 after the first mask is removed and the second mask is formed thereon to expose a PMOS region according to an embodiment of the invention.

FIG. 8 shows a top view of the substrate structure shown in FIG. 4 prior to ion-implanting the compression element in the PMOS region. The dotted line shows an interface between a device region 32 and the STI region 16 surrounding the device region 32. The second mask 22 covers not only the STI region 16 but also portions of the device region 32 except for a center portion of the device region expected to be a channel region for a PMOS device to be formed.

Thus, according to an embodiment of the invention, the compression element is ion-implanted to an area of the PMOS device region 32 which is smaller than that of the NMOS device region because the strain needed in the PMOS region is preferably only longitudinally compressive as seen in FIG. 1.

As explained above, the invention enables improving device performance of both an N type device and a P type device by selectively applying tensile stain in the active area, on which an N type device is formed and selectively applying compressive strain in the active region, on which a P type device is formed.

The tensile strain is created by expanding a portion of the substrate underlying the N type device. The expanded portion of the substrate pushes up the buried oxide layer and the silicon layer, thereby creating tensile stress to the active region of the silicon layer in the NMOS area. The compressed portion of the substrate pulls down a portion of the substrate underlying the P type device, thereby creating compressive stress to the active region of the silicon layer in the PMOS area.

The selective application of tensile strain and compressive strain is obtained by using readily available processing steps. Especially, since only two additional photolithography steps are required for the masking steps, the invention achieves significant improvement in device performance without significant increase in manufacturing costs.

While the invention has been described in terms of embodiments, those skilled in the art will recognize that the invention can be practiced with modification within the spirit and scope of the appended claims.

What is claimed is:

1. A method for manufacturing a semiconductor device, comprising steps of:
   forming a buried oxide layer on a silicon substrate;
   forming a semiconductor layer on the buried oxide layer such that the buried oxide layer is disposed between the semiconductor layer and the substrate;
   performing a first ion-implanting step of an expansion element in a first region of the substrate while masking a second region of the substrate;
   performing a second ion-implanting step of a compression element in the second region of the substrate while masking the first region of the substrate, wherein the second ion-implanting step is separate from the first ion-implanting step;

expanding the expansion element to expand the first region of the substrate to push up a first portion of the semiconductor layer and a first portion of the buried oxide layer;
compressing the compression element to compress the second region of the substrate to pull down a second portion of the semiconductor layer and a second portion of the buried oxide layer;
forming a first gate oxide layer of an N type device on the first portion of the semiconductor layer;
forming a first gate electrode on the first gate oxide layer;
forming a second gate oxide layer of a P type device on the second portion of the semiconductor layer; and
forming a second gate electrode on the second gate oxide layer.

2. The method of claim 1, wherein the step of expanding the first region comprises a step of ion-implanting the expansion element in the first region of the substrate.

3. The method of claim 2, wherein the expansion element is ion-implanted at an implantation concentration of approximately $1\times10^{14}$ atoms/cm$^2$ to $5\times10^{16}$ atoms/cm$^2$ and at an implantation energy of approximately 30 KeV to 300 KeV.

4. The method of claim 2, wherein a concentration peak of the implanted expansion element is confined within the first region.

5. The method of claim 3, wherein the expansion element is $O_2$.

6. The method of claim 1, wherein the step of compressing the second region comprises a step of ion-implanting the compression element in the second region of the substrate.

7. The method of claim 6, wherein the compression element is ion-implanted at an implantation concentration of approximately $1\times10^{14}$ atoms/cm$^2$ to $5\times10^{16}$ atoms/cm$^2$ at an implantation energy of approximately 30 KeV to 300 KeV.

8. The method of claim 6, wherein a concentration peak of the implanted compression element is confined within the second region.

9. The method of claim 6, wherein the compression element is He, Ar, or noble gas.

10. A method for manufacturing a semiconductor device, comprising steps of:
forming a buried oxide layer on a silicon substrate;
forming a semiconductor layer on the buried oxide layer, wherein the buried oxide layer is disposed between the semiconductor layer and the substrate;
performing a first ion-implanting step of an expansion element in a first region of the substrate while masking a second region of the substrate;
performing a second ion-implanting step of a compression element in the second region of the substrate while masking the first region of the substrate, wherein the second ion-implanting step is separate from the first ion-implanting step;
expanding the expansion element to expand the first region of the substrate to provide a tensile stress in the semiconductor layer;
compressing the second region of the substrate to provide a compressive stress in the semiconductor layer by annealing to activate the compression element;
after the expanding, forming a first gate oxide layer of an N type device on the semiconductor layer over the first region of the substrate;
forming a first gate electrode on the first gate oxide layer;
after the compressing, forming a second gate oxide layer of a P type device on the semiconductor layer over the second region of the substrate; and
forming a second gate electrode on the second gate oxide layer,
wherein the expanding pushes up a first portion of the buried oxide layer; and
the compressing pulls down a second portion of the buried oxide layer.

11. The method of claim 10, wherein the compression element is ion-implanted at an implantation concentration of approximately $1\times10$ atoms/cm$^2$ to $5\times10^{16}$ atoms/cm$^2$ and at an implantation energy of approximately 30 KeV to 300 KeV.

12. The method of claim 10, wherein the step of expanding the first region comprises a step of ion-implanting the expansion element in the first region of the substrate.

13. The method of claim 12, wherein the expansion element is ion-implanted at an implantation concentration of approximately $1\times10^{14}$ atoms/cm$^2$ to $5\times10^{16}$ atoms/cm$^2$ and at an implantation energy of approximately 30 KeV to 300 KeV.

14. The method of claim 12, wherein the expansion element is $O_2$ and the compression element is He, Ar, or noble gas.

15. The method of claim 1, wherein:
the step of expanding the first region comprises ion-implanting the expansion element in the first region of the substrate and annealing to activate the expansion element; and
the step of compressing the second region comprises ion-implanting the compression element in the second region of the substrate and annealing to activate the compression element.

16. The method of claim 15, wherein
the expanding the first region pushes up the first portion of the buried oxide layer and the first portion of the semiconductor layer thereby increasing tensile stress in the first portion if the semiconductor layer, and
the compressing the second region pulls down the second portion of the buried oxide layer and the second portion of the semiconductor layer thereby increasing the compressive stress in the second portion of the semiconductor layer.

17. The method of claim 10, wherein the step of expanding the first region comprises ion-implanting the expansion element in the first region of the substrate and annealing to activate the expansion element.

18. The method of claim 17, wherein
the expanding the first region pushes up the first portion of the buried oxide layer and a first portion of the semiconductor layer thereby increasing tensile stress in the first portion of the semiconductor layer, and
the compressing the second region pulls down the second portion of the buried oxide layer and a second portion of the semiconductor layer thereby increasing the compressive stress in the second portion of the semiconductor layer.

19. The method of claim 1, further comprising:
forming a shallow trench isolation region in the semiconductor layer between the first portion of the semiconductor layer and the second portion of the semiconductor layer; and
annealing to activate the expansion element and the compression element, wherein the annealing causes the expanding and the compressing;
wherein the performing the first ion-implanting step comprises:
forming a first mask layer on the semiconductor layer, wherein the first mask layer selectively exposes the first portion of the semiconductor layer and masks the second portion of the semiconductor layer;
ion-implanting the expansion element through an opening in the first mask layer, through the semiconductor layer, through the buried oxide layer, and into the first region of the substrate; and removing the first mask layer;

the performing the second ion-implanting step comprises:

forming a second mask layer on the semiconductor layer, wherein the second mask layer selectively exposes the second portion of the semiconductor layer and masks the first portion of the semiconductor layer;

ion-implanting the compression element through an opening in the second mask layer, through the semiconductor layer, through the buried oxide layer, and into the second region of the substrate; and removing the second mask layer;

the forming the first gate oxide layer is performed after the expanding, such that the first portion of the semiconductor layer and the first portion of the buried oxide layer are pushed up prior to the first gate oxide layer being formed; and the forming the second gate oxide layer is performed after the compressing, such that the second portion of the semiconductor layer and the second portion of the buried oxide layer are pulled down prior to the second gate oxide layer being formed.

* * * * *